United States Patent
Albou et al.

(10) Patent No.: US 11,162,657 B2
(45) Date of Patent: Nov. 2, 2021

(54) LIGHT DEVICE CAPABLE OF GENERATING A SOURCE WITH FINE PIXELS

(71) Applicant: VALEO VISION, Bobigny (FR)

(72) Inventors: Pierre Albou, Bobigny (FR); Vanesa Sanchez, Bobigny (FR); Marine Courcier, Bobigny (FR)

(73) Assignee: VALEO VISION, Bobigny (FR)

( * ) Notice: Subject to any disclaimer, the term of this patent is extended or adjusted under 35 U.S.C. 154(b) by 31 days.

(21) Appl. No.: 16/314,150

(22) PCT Filed: Jun. 29, 2017

(86) PCT No.: PCT/EP2017/066182
§ 371 (c)(1),
(2) Date: Dec. 28, 2018

(87) PCT Pub. No.: WO2018/002252
PCT Pub. Date: Jan. 4, 2018

(65) Prior Publication Data
US 2020/0182431 A1    Jun. 11, 2020

(30) Foreign Application Priority Data
Jul. 1, 2016  (FR) ...................... 1656341

(51) Int. Cl.
*F21S 41/663* (2018.01)
*F21S 41/143* (2018.01)
(Continued)

(52) U.S. Cl.
CPC .......... *F21S 41/663* (2018.01); *F21S 41/143* (2018.01); *F21S 41/153* (2018.01); *F21S 41/192* (2018.01);
(Continued)

(58) Field of Classification Search
CPC .... B60Q 1/2696; B60Q 1/085; B60Q 1/2611; B60Q 1/2607; B60Q 2300/45;
(Continued)

(56) References Cited

U.S. PATENT DOCUMENTS

| 7,521,872 B2 | 4/2009 | Bruning |
| 2004/0075393 A1* | 4/2004 | Ito ........................ H05B 45/10 315/77 |

(Continued)

FOREIGN PATENT DOCUMENTS

| CN | 105258057 A | 1/2016 |
| DE | 103 15 133 A1 | 10/2004 |

(Continued)

OTHER PUBLICATIONS

International Search Report dated Aug. 16, 2017 in PCT/EP2017/066182 filed Jun. 29, 2017.

*Primary Examiner* — Wei (Victor) Y Chan
(74) *Attorney, Agent, or Firm* — Oblon, McClelland, Maier & Neustadt, L.L.P.

(57) ABSTRACT

A light module, notably of a vehicle, including a semiconductor light source including a plurality of light-emitting units of submillimetric dimensions distributed in different selectively activatable light zones, at least one optic, capable of receiving the light rays emitted by the selectively activatable light zones and of deflecting them out of the light module, the shaping optic being arranged in such a way as to form an image of the light source including a plurality of pixels, the light source and the optic being arranged in such a way that these pixels exhibit an angular aperture of at most 0.4° in at least one given direction.

20 Claims, 4 Drawing Sheets

(51) Int. Cl.
    *F21S 41/153*     (2018.01)
    *F21S 41/19*     (2018.01)
    *F21Y 105/16*     (2016.01)
    *F21Y 115/10*     (2016.01)
    *F21W 102/155*     (2018.01)
    *H01L 27/15*     (2006.01)
    *H01L 33/24*     (2010.01)
    *H01L 33/32*     (2010.01)
    *H01L 33/50*     (2010.01)
    *H01L 33/62*     (2010.01)

(52) U.S. Cl.
    CPC .... *F21W 2102/155* (2018.01); *F21Y 2105/16* (2016.08); *F21Y 2115/10* (2016.08); *H01L 27/156* (2013.01); *H01L 33/24* (2013.01); *H01L 33/32* (2013.01); *H01L 33/505* (2013.01); *H01L 33/62* (2013.01)

(58) Field of Classification Search
    CPC .............. B60Q 1/143; B60Q 2300/112; B60Q 2300/41; B60Q 2300/42; B60Q 2900/10
    USPC ........................... 315/77, 192, 246, 287, 312
    See application file for complete search history.

(56) References Cited

U.S. PATENT DOCUMENTS

| | | |
|---|---|---|
| 2006/0198118 A1 | 9/2006 | Eichhorn et al. |
| 2010/0117997 A1 | 5/2010 | Haase |
| 2010/0301731 A1* | 12/2010 | Morikawa ................. F21K 9/23 |
| | | 313/113 |
| 2011/0205049 A1 | 8/2011 | Kmetec et al. |
| 2011/0254034 A1 | 10/2011 | Konsek et al. |
| 2012/0170300 A1 | 7/2012 | Kathmann et al. |
| 2013/0169155 A1* | 7/2013 | Nakashima .............. B60Q 1/14 |
| | | 315/82 |
| 2013/0329440 A1 | 12/2013 | Tsutsumi et al. |
| 2014/0098556 A1 | 4/2014 | Von Malm et al. |
| 2014/0239327 A1 | 8/2014 | Konsek et al. |
| 2015/0043239 A1 | 2/2015 | Han |
| 2015/0069433 A1 | 3/2015 | Haase |
| 2015/0316234 A1* | 11/2015 | Samonji ............. G02B 27/0983 |
| | | 362/84 |
| 2016/0144771 A1 | 5/2016 | Miyachi et al. |
| 2016/0163922 A1* | 6/2016 | Yoo ....................... H01L 33/387 |
| | | 257/13 |

FOREIGN PATENT DOCUMENTS

| | | |
|---|---|---|
| DE | 10 2007 052 742 A1 | 5/2009 |
| DE | 10 2010 047 376 A1 | 4/2012 |
| DE | 10 2012 008 930 A1 | 12/2012 |
| EP | 2 677 232 A1 | 12/2013 |
| EP | 3 026 705 A1 | 6/2016 |
| WO | WO 2008/109296 A1 | 9/2008 |
| WO | WO 2010/014032 A1 | 2/2010 |
| WO | WO 2012/156121 A1 | 11/2012 |

* cited by examiner

LIGHT DEVICE CAPABLE OF GENERATING A SOURCE WITH FINE PIXELS

The present invention relates to the field of vehicle light devices emitting light beams formed from several images.

Vehicle light devices are known that generate road-illuminating light beams making it possible to associate different images of one or more light sources to form the corresponding light beam. These devices make it possible to adapt the light beam by switching on or by switching off some of these parts. By increasing the number of parts that make it possible to form the light beam, it is possible to refine the adaptation capability thereof.

However, given the physical dimensions of the elements making it possible to generate a part of the light beam, notably the light sources and the associated optics, a person skilled in the art is confronted with a minimum limitation in the size of the smallest portions that make up this type of light beam. That therefore limits the possibilities of refining the shape of the beam.

One problem targeted by the present invention is therefore how to improve the adaptability of the beam, particularly in its shape.

So, a first object of the present invention is a light module, notably of a vehicle, this light module comprising:
- a semiconductor light source comprising a plurality of light-emitting units of submillimetric dimensions, the units being distributed in different selectively activatable light zones,
- at least one shaping optic, capable of receiving light rays emitted by these selectively activatable light zones and of deflecting them out of the light module, the shaping optic being arranged in such a way as to form an image of the light source comprising a plurality of pixels, the light source being configured and the shaping optic being arranged in such a way that at least a part of these pixels exhibit an angular aperture of at most 1° in at least one given direction.

Thus, the light module according to the invention is capable of emitting a light beam formed by the image of the light source. This image has a precise shape because of the small angular aperture of the pixels that it comprises.

Moreover, by switching off or by switching on the pixels required by the shape of the light beam, it is possible to easily and finely adapt this light beam.

Also, given the small angular aperture of the pixels, it is possible, simply by switching off some of its pixels and switching on other pixels, to successively form two images of identical shapes but having an offset position. That will be perceived by the driver as a displacement of one and the same beam. Given the small angular aperture of the pixels, this displacement will be perceived as fluid. The minimum offset between two images in effect corresponding to the angular aperture of the pixels, the latter being less than or equal to 1°.

It is thus possible to produce an apparent displacement of a light beam with no mechanical displacement device, while having a displacement with a fluidity close to a displacement obtained with mechanical means, such as correctors or actuators.

For example, it is possible to produce a light beam exhibiting a cut-off line, notably horizontal, and to adjust the position of this cut-off line simply by switching on or switching off at least one segment of the image comprising several aligned pixels. That can notably be carried out in such a way as to adjust the height of a low beam, as in the case of the manual correction, or even to set the position thereof based on the accelerations or decelerations of the vehicle.

The invention also exploits the use as light source of a semiconductor light source comprising a plurality of light-emitting units of submillimetric dimensions. The units of the light source are distributed in the selectively activatable light zones.

Given the submillimetric dimension of these units, it is possible to produce selectively activatable light zones on the same light source with a size that is small enough to produce pixels with an angular aperture of at most 1° and with a spacing between the selectively activatable light zones that is very reduced, for example a spacing corresponding to a spacing between two successive units. Dark strips between pixels whose size would be too great with respect to the size of these pixels are thus avoided.

Since the space between the selectively activatable light zones is reduced compared to the size of these light zones, it is possible to have an image having small contiguous pixels with a smaller focal length than with, for example, a matrix of conventional LEDs.

In this application, the angular aperture of an image or of a portion of this image, such as a pixel, corresponds to the light beam which forms this image or this portion. In other words, it is the angle between the rays forming the limit of this light beam. When an angular aperture in a given direction is mentioned, that amounts to considering a limit angle in a plane containing the overall direction of light emission by the light module, this plane being parallel to the given direction. This limit angle corresponds to the angle between the rays forming the limit of this beam or this portion of beam and intersecting this given direction and in this plane.

Moreover, another advantage is that, by using a single light source, a single connection system can be used, by directly linking this light source to the electrical power supply. The result thereof is a saving in terms of number of light sources, of connections and of wiring looms.

In addition, the light module can be arranged in such a way that its optical axis passes through the central zone.

Moreover, the light-emitting units of submillimetric dimensions can be light-emitting rods of submillimetric dimensions. In such a case, hereinafter in the application, the light source is called rod light source.

The light module according to the invention can optionally comprise one or more of the following features:
- at least some pixels exhibit an angular aperture of at most 0.6°, preferably at most 0.4° in at least one given direction; that makes it possible to generate an apparent movement of the light beam with a precision even closer to that which could be obtained with mechanical actuation means and which is difficult, even impossible, to achieve with other types of sources;
- at least some pixels exhibit an angular aperture of at most 0.1° in at least one given direction; that makes it possible to generate an apparent movement of the light beam with a precision at least equal to that which could be obtained with mechanical actuation means;
- all the pixels exhibit, in at least one given direction, an angular aperture of at most 1°, preferably at most 0.6°, preferably at most 0.4°, preferably at most 0.1°; in particular, all of the light beam emitted by the light device can be formed by these pixels; in these different cases, the resolution is all the better when the angular aperture is small;

the light source and the shaping optic are arranged in such a way that each pixel is an image of one of the selectively activatable light zones; in particular, each light zone is capable of forming one and only one pixel; because of this, the electrical powering or not of one of the selectively activatable light zones makes it possible to switch it on or switch it off and therefore make the corresponding pixel appear or not appear in the image; an image is thus produced with a zone comprising several pixels, making it possible to more easily drive its shape, and therefore that of the light beam;

the selectively activatable light zones have a size less than or equal to 350 micrometers, notably less than or equal to 100 micrometers; the light source with submillimetric light-emitting units, notably according to the embodiments where the latter is a rod light source, is advantageous for such an embodiment, which makes it possible to have a less bulky light module;

the selectively activatable light zones are arranged in such a way that the image of the light source comprises a central zone and at least one off-center zone between said central zone and edges of the image of the light source, the majority of the pixels being distributed in said central zone; this embodiment is more economical because the light zone arrangement is limited to the point where it is most important to have a good image resolution, in particular around the center of an illuminating light beam of a motor vehicle;

the selectively activatable light zones are arranged in such a way that the image of the light source comprises a central zone and at least one off-center zone between said central zone and edges of the image of the light source, the plurality of the pixels being distributed only in said central zone; the selectively activatable light zones are arranged in such a way that the image of the light source comprises a central zone and an off-center zone between said central zone and edges of the image of the light source, the plurality of pixels being distributed in the central zone and in the off-center zone, the pixels inside the central zone being smaller than those situated outside of the central zone; the resolution is thus enhanced on these two zones, but more specifically at the center; the resolution of all of the beam is better than for the embodiment of the preceding paragraph, while allowing for a simpler production of the selectively activatable light zones;

the selectively activatable light zones capable of participating in the forming of said central zone are arranged in such a way that the vertical amplitude within which said central zone can be formed is at least 6°; that makes it possible, notably in the context of a low beam, to produce an apparent vertical movement of the light beam, so as to correct the height thereof dynamically based on traffic conditions;

the vertical amplitude of the preceding paragraph is at least 8°; thus, in addition to a dynamic correction, it is possible to set the beam for it to be able to produce, depending on this setting, either a code function or a town function, which is also a beam with a cut-off line but set lower in height, or even a motorway function, which is also a beam with a cut-off line but set higher in height;

the vertical amplitude of the preceding paragraph or that preceding it is at least 14°; thus, in addition to a dynamic correction, it is possible to produce the adjustment setting of the reference height of the beam, this reference height notably being that which is established on the horizontal and when stopped, and around which the dynamic correction is performed; that makes it possible, for example, to calibrate the reference height of the light module in a vehicle;

according to the preceding paragraph, the light module can comprise a device for driving the selectively activatable light zones which is capable of being programmed to associate a given activation configuration of the light zones with a reference activation configuration;

the programming of the driving device targeted in the preceding paragraph can be done when it is mounted, by saving this association once the cut-off line is at the desired height; it is thus no longer necessary to have manual correctors;

according to the two preceding paragraphs, the driving device can be arranged to receive a calibration control signal and be capable of associating a given activation configuration of the light zones with a reference activation configuration based on the reference control signal; that thus makes it possible to set the reference position of the beam other than in relation to mounting plays, notably based on the load of the vehicle;

the light module comprises a driving device comprising a signal receiver, notably an electrical signal, and comprising a memory associating the reference configuration with a given signal;

according to the preceding paragraph the selectively activatable light zones capable of participating in the forming of said central zone are arranged in such a way that the horizontal amplitude within which said central zone can be formed is at least approximately 10°, at least 20°, at least 40° or at least 90°;

that makes it possible, notably in the context of a low beam, to produce an apparent horizontal movement of the beam, so as to correct the latter either for setting purposes, notably dynamically based for example on turns; for example, to produce a selective high beam, a minimum of 10° is necessary, the horizontal aperture being able to be at least 40° for a fine resolution over all of this beam;

according to another example, to produce a low beam whose position is adjusted according to turns, a minimum of 20° is necessary; the horizontal aperture can be at least 90° for a fine resolution over all of a low beam;

the light source comprises a central group of selectively activatable light zones, the selectively activatable light zones forming the edges of the central group corresponding to the pixels forming the edges of the central zone; this is an exemplary embodiment of the central zone that makes it possible to more easily drive the powering of the light source; the production of an apparent vertical movement in the central zone is thus facilitated;

the central group is arranged in a central matrix of light zones; the matrix arrangement facilitates the selective control of the light zones for to the image forming the light beam a given form;

the central matrix is of rectangular or square shape;

the central matrix is arranged in such a way that all the lines of light zones do not have the same number of columns; for example, the central matrix can be inscribed in an ellipse, or another shape, whose edges coincide with the light zones of the edges of the matrix;

the light source comprises a central matrix of light zones, the light zones forming a third edge of the central matrix corresponding to the rightmost pixels capable of being switched on to form the central zone, the light zones of a second edge of the central matrix opposite this first edge corresponds to the leftmost pixels capable of being switched on to form the central zone, the angle between these rightmost pixels and these leftmost pixels corresponding to the horizontal amplitude within which said central zone can be formed; this is an exemplary embodiment of the central zone that makes it possible to drive the powering of the light source to give an apparent horizontal movement to the central zone;

the angular aperture of the pixels is identical in at least two directions; that makes it possible to produce a precise apparent movement in these two directions; in particular, these directions can be a vertical direction and a horizontal direction, to improve the resolution both of horizontal movements and of vertical movements;

the pixels and/or the light zones have a square, rectangular, triangular and/or trapezoidal shape, that facilitates the matrix formation of the image of the light source;

the tiling of the image and/or of the central zone by the pixels is periodic; the pixels are thus arranged according to a matrix comprising rows and columns of identical pixels; that makes it possible to reduce the light manufacturing costs, particularly if it is a rod light source, in particular when the image of a light zone forms the image of a pixel;

the pixels are of different shapes and/or sizes in the image and/or in the central zone; the tiling is thus said to be aperiodic, some of the pixels not being able to be obtained by repeated displacement of one and the same basic pixel pattern over this image and/or this central zone; it is nevertheless possible to have, in portions of this image or of this central zone or the tiling is periodic; these embodiments make it possible to reduce the number of pixels according to the location of the image and therefore to simplify production of the rod light source, in particular the addressing of its light zones;

the light zones are separated by opaque or reflecting or diffusing kerbs; this is a means of production allowing the formation of clearly delimited pixels, thus facilitating the forming of the image;

the light source comprises a substrate on which the light-emitting units and the kerbs are directly arranged; that facilitates the integration of the kerbs in the light source;

the light source is a rod light source and comprises a substrate from which the rods and the kerbs extend; that facilitates the integration of the kerbs in the rod light source;

the kerbs are obtained by crystalline growth of an opaque material; they can thus be of a size comparable to that of the rods, rendering the separation zone between the light zones fine in relation to the size of the light zone;

the light source comprises a connection means intended to be connected directly or indirectly to an electrical power supply, for example the battery of a vehicle, this connection means being arranged to electrically and independently power the different light zones; the light source can thus receive the electrical power supply for the different light zones from a single connection point;

the substrate comprises a cathode linked to or forming a negative pole of the connection means; this is a simple connection of the light source;

the light source comprises at least as many anodes as light zones, each anode being arranged in such a way as to be in contact with each of the units of one and the same light zone, notably each anode being connected to one or more positive terminals of the connection means or each forming a positive terminal of the connection means; this is a compact and simple exemplary embodiment of the connection of each light zone, compactness that is all the more improved when the anodes are connected to the same connection means;

each anode is formed by a conductive layer deposited on top of the substrate, alongside the units, and electrically joining the units to one another; this is a more compact exemplary embodiment of the light source;

the light source is mounted directly or indirectly on an electronic card comprising a driving device capable of selectively powering the light zones based on a given signal, notably an electrical signal; it is thus possible to send a control signal corresponding to a given light beam shape, comprising a spatial distribution of the light intensity, and to retranscribe the latter into an activation, optionally of a given intensity, or a deactivation of the different light sources selectively; for example, the driving device can comprise a multiplexer comprising a decoding chip, the latter making it possible to retranscribe the control signal into the activation and/or deactivation command for the light sources;

the light source is mounted directly or indirectly on a first face of the electronic card and the driving device is mounted directly or indirectly on a second face of the electronic card; that makes it possible to gain more compactness;

the shaping optic comprises an optic for projecting the light emitted by the light source; this is a simple means of forming a pixelated image with the light source which comprises selectively activatable light zones;

the projection optic creates a real, and possibly an amorphic, image of a part of the device; for example, this part can be: the light source itself, a cover screening a part of the light rays emitted by the light source, an intermediate image of the light source;

the real image targeted by the preceding paragraph is created by the projection optic at a very great distance compared to the dimensions of the light module; for example, the image can be created at infinity or at a finite distance of a ratio of the order of at least 30 times, preferably 100 times, the greatest dimension of the light module;

this projection optic can consist of one or more reflectors, or else one or more lenses, or even a combination of these possibilities;

the image of the light source forms at least a part of a lighting beam, notably comprising a cut-off line; the invention is particularly suited to this type of beam because it allows a change of position of the cut-off line without the use of a mechanical actuator;

the central zone comprises said cut-off line.

Another object of the invention is a vehicle light device comprising at least one light module according to the invention. This light device can be a vehicle headlight.

This light device makes it possible in particular to produce a photometric function, notably regulatory, such as a low beam, a high beam, a motorway beam.

When the light device and the light module are arranged in such a way as to produce an apparent displacement of the light beam so as to adjust the position of this beam as in the case of the manual correction, the light device need not have a mechanical system for adjusting the orientation of the module.

However, even in such a case, the light device can comprise, in addition, a mechanical system for adjusting the orientation of the light module, for example an adjusting screw. Thus, if the device for driving the light sources becomes defective, it is possible to use the mechanical adjustment system, which therefore forms a backup system.

Moreover, some regulations require the light devices to have a mechanical adjustment system. It is therefore in this case possible to equip the light device with a light module according to the invention and with a mechanical adjustment system.

This is for example the case in the United States with regulation FMVSS108, which in particular requires each front vehicle headlight to be equipped, once mounted in the vehicle, with a mechanical system for horizontal and vertical adjustment of the light beam, accessible without dismantling other parts of the vehicle, and that can be actuated with a simple tool.

Another object of the invention is a vehicle comprising a vehicle light device and/or a light module according to the invention.

The light source, including when the light source is a rod light source, can optionally have one or more of the following features:
the units have a thickness of between 0.1 micrometers ($\mu m$) and 2 $\mu m$, notably between 1.4 $\mu m$ and 1.6 $\mu m$; that makes it possible to increase the light-emitting surface and confers a better light efficiency at the light source; for example, the units are rods 1 $\mu m$ thick;
the units, in particular when these units are rods, have for example a height of between 2 $\mu m$ and 10 $\mu m$; that makes it possible to increase the light-emitting surface and improves the light efficiency of the light source; for example, the units are rods 8 $\mu m$ high;
the units are separated from one another by a distance of between 1 $\mu m$ and 35 $\mu m$, preferentially between 3 $\mu m$ and 30 $\mu m$, preferentially between 3 and 10 $\mu m$;
the maximum distance corresponds to a minimum density in units; although this maximum distance is not limiting, it gives the best results in terms of light efficiency, namely the ratio of the optical power emitted to the electrical power injected, notably for a motor vehicle light module;
the minimum of 1 $\mu m$ allows an easier production of these light sources, in particular in the case of a rod light source, that facilitates the production of the growth of the rods; nevertheless, when the units have a certain height, notably when these units are rods, and when these units are too dense, the emission from some units can be hampered by the presence of other units, which screen them; the efficiency of the light source is significantly enhanced with a distance between units of at least 3 $\mu m$;
the units are rods which extend from the substrate in a preferred direction;
the units comprise a nitride of metal, notably a nitride of gallium, and/or the substrate is essentially silicon-based; the nitrides of metal and in particular of gallium make it possible to obtain good results in terms of light emission;
silicon makes it possible to produce a light source, and therefore a light device, less costly than the conventional LEDS;
the light source comprises a layer of a luminophore arranged above the units in such a way that the luminophore receives the rays emitted by the units and in its turn emits light rays, corresponding to the light rays emitted by the corresponding light zone.

Another object of the invention is a method for controlling a light module or a light device according to the invention, the method comprising:
a step of sending at least one control signal corresponding to a given light beam and/or a required position, and
a step of selecting the light zones to be electrically powered based on this control signal.

The control method according to the invention can optionally comprise one or more of the following features:
the control signal is sent by the activation of a command via a user interface;
the control signal is sent by a sensor and/or a computer comprised in the light module, the light device and/or the vehicle;
the control step comprises the following substeps:
the determination of the position required for the light beam associated with the control signal,
the switching off and the switching on of the light zones to give the light beam the required position;
the light zones are switched on and/or switched off by rows and/or column by column between the initial position of the light beam and the required position of this light beam by the control signal; there is thus an apparent displacement conferred to the light beam having a fluidity close, even identical, to that of the mechanical actuator;
the control signal is an electrical signal, a signal conveyed by electromagnetic waves, notably by WiFi or by infrared;
the method comprises a calibration step comprising the following substeps:
the reception of a control signal called calibration control signal and subsequent switch to the following substeps,
the determination of the position required for the light beam,
the determination of a given configuration of light zones having to be switched off or switched on to give the light beam the required position,
the saving of this given configuration, notably in a memory of a device for driving the selectively activatable light zones, as a reference configuration;
the calibration control signal is sent by a computer which, based on the load, determines the required given configuration;
the calibration control signal is generated on startup, notably if the vehicle is horizontal; notably a computer, based on images acquired by a camera, can determine the height of the horizon and which given configuration is required to set the reference height of the beam; thus, on each startup, depending on the load of the vehicle, the computer will determine the reference setting, notably around which a dynamic correction of the light beam will be able to be made.

The computer can be arranged in the light module, the light device or the vehicle according to the invention.

Note that, in the various objects of the invention, the driving device is preferentially comprised in the light device or in the light module.

Unless otherwise indicated, when used for the arrangement of the light module or of the light device, the terms "front", "rear", "bottom", "top", "side", "longitudinal", "transverse" refer to the direction of light emission out of the light module or of the light device. When they are employed for a light beam, these terms apply in relation to a projection of this beam onto a vertical screen at a distance from this light module or from this light device.

Other features and advantages of the invention will become apparent on reading the detailed description of the following nonlimiting examples, for an understanding of which reference will be made to the attached drawings, in which.

Note that these figures are schematic; the scales between the different elements should not be taken into consideration.

Figure 1:
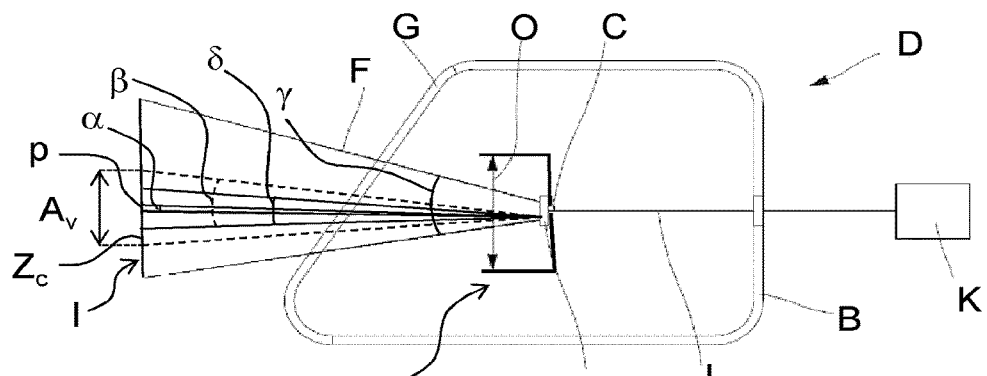
FIG. 1 is a longitudinal vertical section of a light device according to the invention.

FIG. 1 illustrates an example of a vehicle light device D according to the invention comprising a light module M according to the invention. This light device D is a headlight capable of emitting an illuminating light beam, notably a low beam F.

The light device D comprises a housing B closed by a transparent lens G, thus delimiting an internal volume.

The light module M is arranged inside this internal volume. The light module comprises a light source S, which emits rays making it possible to form, in this example, all of the low beam F. As will be detailed later, this light source S comprises different selectively activatable light zones, that is to say that can be powered electrically or switched off independently based on a received control signal.

The light module M comprises at least one connector C linked to the light source S and intended to be connected to an electrical power supply K to electrically power the light source S, notably via a single wiring loom J.

The light module M comprises a shaping optic O arranged to project the image of the light source S, hereinafter called global image I, in such a way as to form the low beam F. In this example, this shaping optic O is a convergent lens focused at the light source S level. Nevertheless, the invention is not limited to this type of optic, and the shaping optic could also be chosen from a reflector, a combination of lenses, a combination of reflectors, and a combination of lenses and of reflectors.

The global image I comprises a plurality of pixels p, at least in a central zone Zc of the global image I.

As can be seen in FIG. 1, the size of the global image I is a function of the distance at which the projection is performed from the light module M. Also, in the motor vehicle lighting field, it is common practice to express the size of the image not in distance units but in terms of angular aperture, which is valid whatever the distance to the optical module.

Thus, the size of the global image I corresponds to an angular aperture γ of the low beam F. It can also be seen that the central zone Zc in the global image I corresponds also to an angular aperture β.

Similarly, each of the pixels p of this central zone Zc also has a size defined by an angular aperture α.

According to the invention, the angular aperture α of the pixels p is at most 1°, at least in the central zone Zc. In this example, the latter is of at most 0.4°.

The light module M according to the invention is arranged in such a way that the light zones are capable of being activated in such a way that the central zone Zc can, depending on the light zones activated, appear within a window in the global image I which corresponds to a vertical amplitude Av.

In other words, this vertical amplitude Av corresponds to the angular aperture of a zone where the central zone can be formed by the light module. This angular aperture is hereinafter called positioning angular aperture δ.

The arrangement of the light module M, and in particular of the shaping optic O and of the light source S, is such that each pixel p corresponds to an image of a light zone of the light source S and that this light zone forms only one pixel. Thus, a matrix of pixels p that can be projected in the image has a corresponding matrix of light zones that can be activated in the light source S.

Figure 2:
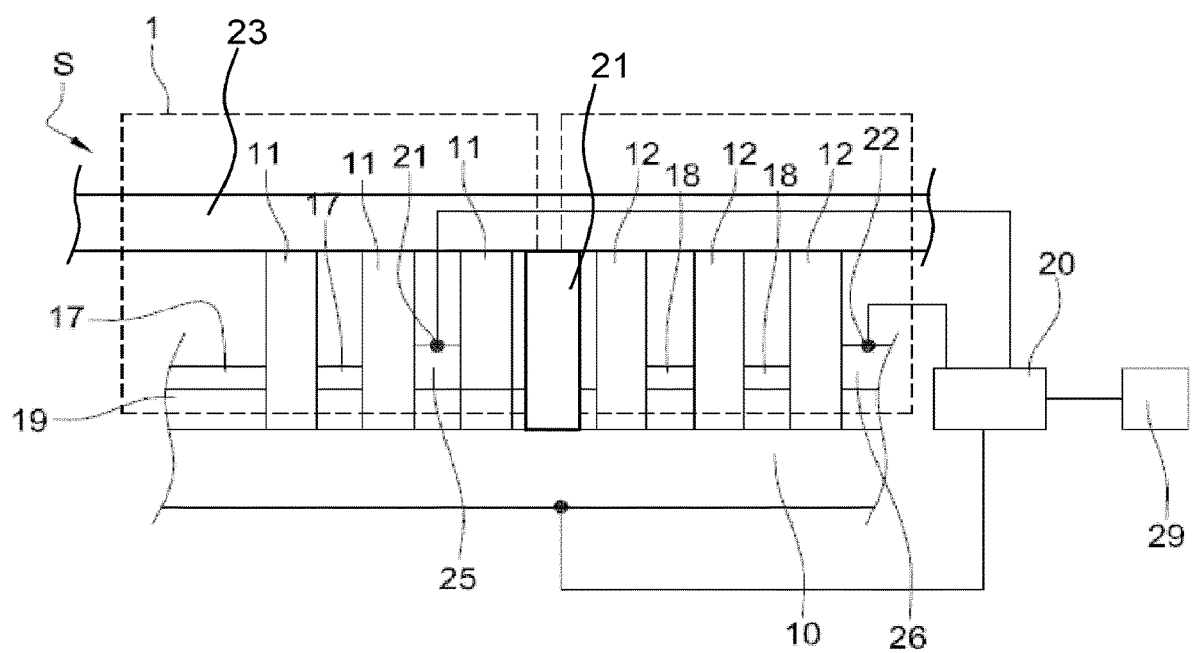
FIG. 2 represents a schematic cross-sectional view of a rod light source of a light device according to the invention.
Figure 3:
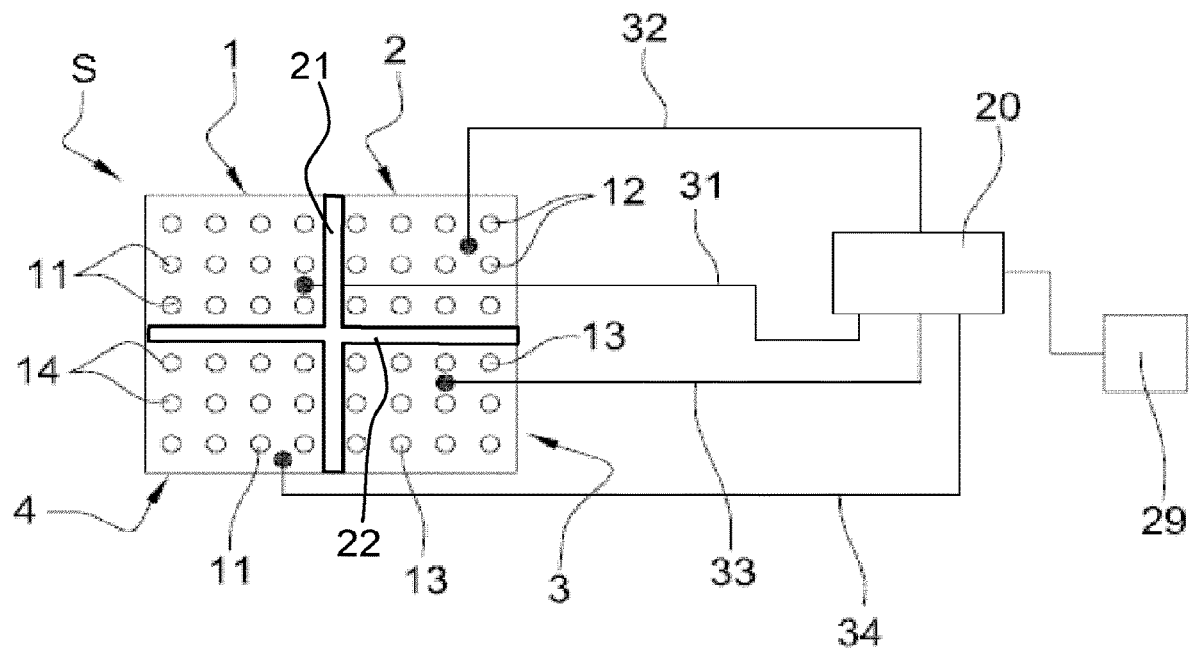
FIG. 3 represents a schematic cross-sectional plan view of FIG. 2.

These light zones are detailed in FIGS. 2 and 3, which schematically represent a portion of the light source S arranged in the light device D.

In this exemplary embodiment, this light source S is a rod light source, whose rods form light-emitting units.

As illustrated in FIG. 2, the light source S, here represented in cross section, comprises a substrate 10 from which rods 11, 12, 13, 14 extend in a preferred direction.

This substrate 10 is, notably in this example, silicon, which represents a cost much lower than that of the conventional LEDs, in which the substrates are made of sapphire. The rods 11, 12, 13, 14 can be obtained by crystalline growth on this substrate 10.

The rods 11, 12, 13, 14 are arranged in such a way as to form rods of a light-emitting semiconductive material. The rods 11, 12, 13, 14 can for example be formed mainly from gallium nitride.

For example, these rods 11, 12, 13, 14 comprise a core of semiconductive material that can be doped with electrons, around which is formed a first layer of semiconductive material capable of exhibiting electron deficits, a case sometimes referred to as "hole" or positive charge doped layer. At the interface of this core and of this first layer, an intermediate layer is formed where the electrons and the electron deficits recombine. Thus, each rod 11, 12, 13, 14 is a light-emitting semiconductor element.

A nucleation layer 19 is formed on the substrate 10 and around the rods 11, 12, 13, 14.

Here, the rods 11, 12, 13, 14 are approximately 30 μm apart and each have a height, taken from the nucleation layer to their summit, of 2.5 μm. Their thickness, which corresponds here to the width of the rods in FIG. 1, is 1.5 μm.

The light source S therefore essentially comprises a substrate 10 forming a plate bristling with a multitude of small rods 11, 12, 13, 14, light-emitting and submillimetric, namely whose largest dimension is less than a millimeter.

According to the present invention, the light source S is divided into several light zones 1, 2, 3, 4, corresponding to a distribution of all of the rods 11, 12, 13, 14.

Between each rod 11, 12, 13, 14 of one and the same zone 1, 2, 3, 4, there is deposited an electrically conductive layer, electrically joining these rods, thus forming a distinct anode 25, 26 for each of the light zones 1, 2, 3, 4.

The four anodes 25, 26 thus formed are in contact with the nucleation layer 19, which is itself in contact with the cathode formed by the substrate 10.

Thus, by connecting the anodes 25, 26 and the cathode 10 to a power source, it is possible to supply electricity independently to each of the different light zones 1, 2, 3, 4.

According to an embodiment of the invention, each anode is connected to one or more positive terminals of a connection means 20, intended to be connected to the positive terminal of an electrical power source (not represented) of a vehicle. Similarly, the cathode 10 is connected to the negative terminal of the connection means 20. The activation means therefore allows each of these light zones 1, 2, 3, 4 to be electrically powered.

It is therefore possible to drive this light source S, by selective activation of its light zones 1, 2, 3, 4, via the activation means 20.

The driving can be carried out by a specific means distinct from the light device, or else, as in this example, carried out by a driving device 29 incorporated in the light device.

In this example, the driving is carried out directly by a driving device 29. The latter is linked on the one hand to the connection means 20 and on the other hand to the connector C. The connection means 20, for its part, is linked to each anode 25, 26, via electrical conductors 31, 32, 33, 34.

The driving device 29 and the light source S are mounted on one and the same printed circuit card, not represented. The electrical conductors 31, 32, 33, 34 are formed by electronic tracks of this printed circuit card. Similarly, other electronic tracks link the connection means 20 to the driving device 29.

The light efficiency of the light zones 1, 2, 3, 4 can be improved by depositing a reflecting layer 17, 18 on the nucleation layer 19. This reflecting layer 17, 18 is, for example, deposited on the nucleation layer 19 before the growth of the rods, then holes are formed in this reflecting layer 17, 18, and in the nucleation layer, before the growth of the rods 11, 12, 13, 14 on the substrate 10.

To have a better light efficiency, the rods of the light zones can have the following features:
- a thickness of between 1.4 μm and 1.6 μm, for example 1 μm,
- a height of between 2 μm and 10 μm, for example 8 μm,
- a distance between each rod of between 3 and 10 μm.

In FIG. 3, only four light zones 1, 2, 3, 4 have been represented. However, in this example, the light source S comprises more light zones. These light zones are produced in a central portion of the light source.

Figure 4:
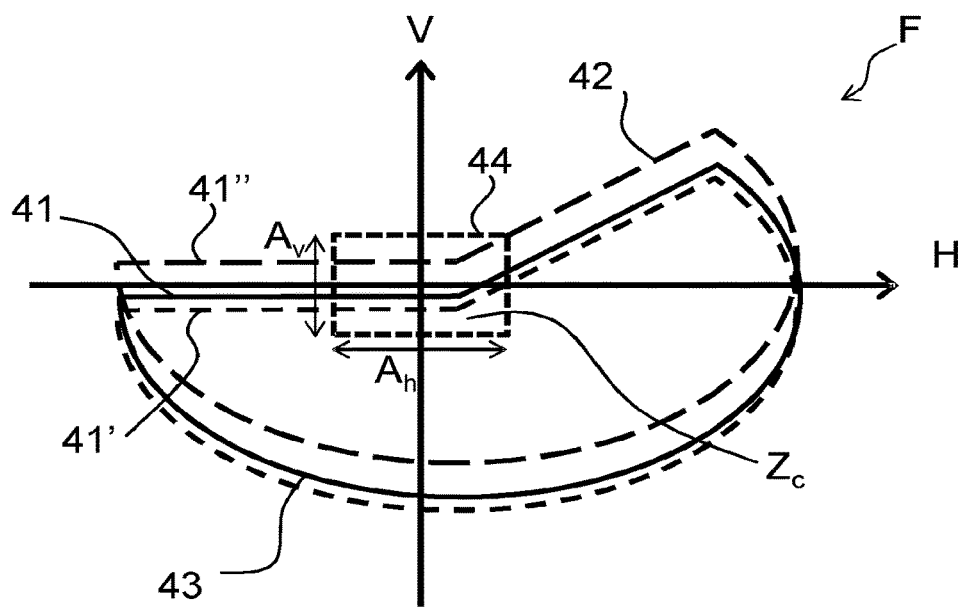
FIG. 4 represents the projection onto a vertical screen, notably at 25 meters, of a low beam emitted by a light module or a light device of a vehicle according to the invention, and two other possible vertical setting positions.

FIG. 4 illustrates, by solid lines, the low beam F obtained in a given position by selectively switching on certain light zones.

In this example, the pattern formed by the set of light zones activated 1, 2, 3, 4 on the light source S is directly imaged by the shaping optic O, to produce the global image I.

The low beam F exhibits a horizontal cut-off line 41 on the left and an oblique cut-off line 42 on the right, for travelling in traffic on the right. The beam extends below these cut-off lines 41, 42 to a limit symbolized by the edge 43. This edge 43 forms the point where the light beam is no longer visible. Nevertheless, unlike the cut-off lines 41, 42, the beam disappears at this edge 43 progressively.

According to the invention, and in this example, an apparent movement of the light beam F is created by switching off and activating certain light zones.

For example, the light source S comprises a central matrix of light zones, comprising the light zones 1, 2, 3 and 4, of FIG. 3. The light zones of this central matrix are capable of being powered according to the command produced by the driving device 29, to form the pixels p in the central zone Zc of the global image I.

In this example, a light pattern is formed on the light source S by the activated light zones. The activated light zones nearest the edge of this pattern form the limits of the beam. Notably, one of the edges of this light pattern is formed by a row of light zones, in this example comprising the light zones 3 and 4 of FIG. 3. The image of this row makes it possible to produce the pixels situated under the horizontal cut-off line 41 and therefore forming the latter. The light zones, including the light zones 1 and 2, situated above this row, form the part of the central zone Zc situated below this horizontal cut-off line 41.

The oblique cut-off line 42 is produced also in the same way by an alignment of activated light zones.

Preferably, the light zones 1, 2, 3 and 4 are situated in a central portion of the zone of the light source S. Outside of this central portion, the light source S also has light zones whose activation makes it possible to produce the light beam F.

Thus, the activation of several light zones forms a set of pixels which, when associated adjacently, form the global image I.

However, the light zones situated in this central portion are of a smaller size than those situated in the portion of the light source situated outside of this central portion.

Thus, the resolution of the global image I, and therefore the precision of the beam F, is better in the central zone Zc. It is in this central zone Zc that it is most important to have a good resolution, because it is above the cut-off line 41 that the vehicles arriving in the oncoming direction will appear most often.

Outside of this central zone Zc, it is not necessary to have such a good resolution. For economic reasons, and for reasons of ease of production of the light source S, the light zones that make it possible to form the pixels outside of this central zone Zc can be produced with larger sizes than those that make it possible to produce the pixels p of the central zone Zc. Nevertheless, it would be possible to imagine an embodiment in which all of the pixels of all of the light source S would have the same size.

The pixels of the central zone Zc exhibit an angular aperture of at most 0.4°. Thus, by switching on the row of light zones situated immediately below the bottom light zones 3, 4 in FIG. 3, it is possible to make a line of pixels appear above the cut-off line 41 previously formed. In this case, the light beam F has a higher horizontal cut-off line, and the impression is that the horizontal cut-off line 41 of the low beam F has been raised by 0.4° upward.

By activating all of the light zones situated immediately above the light zones that make it possible to form horizontal and oblique 42 cut-offs, and by switching off the light zones forming the edges of the beam 43, the light beam will have the same shape as previously but will be offset by 0.4° upward. Thus, in appearance, this will be the same low beam F which will have been displaced by 0.4° upward.

FIG. 4 shows, in dotted lines, a lower limit global image I', and an upper limit global image I" of the low beam F.

These limit global images I' and I" correspond respectively to the lowest image and to the highest image which can be produced to form the low beam F, that is to say in respectively the lowest position and the highest position which can be conferred on the low beam F.

These limit global images have, respectively, a cut-off line 41' and 41", between these positions of the cut-off lines, corresponds several rows of pixels. To switch from the lowest position to the highest position, several rows must therefore be switched on. By switching on, successively, one after the other, each of these rows, for example those above the row of pixels p forming the cut-off line 41, the light module M performs an apparent upward movement of this cut-off line 41, this movement being progressive.

According to an embodiment of the invention, the pixels in the central zone can have an angular aperture α of 0.1°. In such a case, a displacement of the low beam F is created that exhibits a fluidity at least equal to that which could be obtained with an optical module that can be actuated by mechanical means.

FIG. 4 also illustrates a window 44 within which the central zone Zc can be formed. All of the pixels that can be activated in this window 44 have the best resolution. For example, the pixels in this window 44 can have an angular aperture α of 0.1° and the pixels outside of this window 44, an angular aperture α of 0.4°.

This window has a height corresponding to the vertical amplitude Av, and a width corresponding to a horizontal amplitude Ah.

The vertical amplitude Av, which corresponds to the vertical positioning angular aperture δ, can for example be 8°. More particularly, as in FIG. 4, once the light module is in its position of use in a vehicle, it can be distributed on either side of the horizon H between −4° and +4°. That makes it possible to produce a dynamic adjustment of the position of the low beam F.

That also makes it possible:
 to switch from the low beam F to a motorway beam, by raising the cut-off line;
 to switch from the low beam F to a town beam, by lowering the cut-off line;
the dynamic correction remaining possible also for these motorway and town beams.

According to an embodiment not represented, this vertical amplitude can be 14°, namely between −7° and +7° on either side of the horizon H. In this example, the vertical reference position of the light beam F can thus be corrected, simply by switching on and/or switching off corresponding light zones, in the same way as the position of a low beam is manually corrected with mechanical methods.

This adjustment can be done by programming, notably of one or more processors of the electronic card, once the light device is mounted in the vehicle. For example, by setting the desired configuration of light zones switched off or switched on in such a way that the cut-off line is at the correct height, and by saving this configuration as reference configuration, in the processor(s).

This adjustment can also be done based on the load of the vehicle. For example, the multiplexer 29 is linked to a computer of the vehicle, or of the light device, which, when the ignition key of the vehicle is activated but the latter is not moving, engages a calibration procedure. The computer then determines, based on information received by sensors, the load of the vehicle. Then, the computer determines the position at which the low beam F should be placed to avoid dazzling the drivers of the oncoming vehicles or of the vehicles being followed. In effect, depending on the load of the vehicle, its chassis and therefore its light devices are more or less inclined. An adjustment of the height of the low beam F, and in particular of the cut-off line 41, is thus carried out based on the load of the vehicle.

Alternatively, the calibration procedure can be engaged manually, when the driver knows that the road is horizontal, or automatically when the computer determines that the road is horizontal. The computer then determines, based on the information received by sensors, notably a camera, the position of the horizon and determines the position at which the low beam F must be placed so as not to dazzle the drivers of the oncoming vehicles or of the vehicles being followed. The computer then saves this position and the associated configuration of activation of light zones switched off or switched on as reference position and configuration. Thus, whatever the load of the vehicle, the height of the beam will be adjusted to the correct height.

Once this vertical reference position is set, the dynamic adjustment is carried out around this reference position, for example between +3° and −3° around this reference position.

In this case, the multiplexer 29 is linked to a computer of the vehicle, which, based on data received by sensors, such as a camera, a braking device, an acceleration device, determines the inclination of the vehicle and, consequently, the position at which the low beam F must be placed so as not to dazzle the drivers of the oncoming vehicles or of the vehicles being followed. Thus, according to the inclination of the vehicle, the position of the low beam F will be set in real time, by successive formation of images of the light source S. A dynamic adjustment of the height of the low beam F, and in particular of the cut-off line 41, is thus carried out.

Note that, in this FIG. 4, the central zone Zc has a horizontal amplitude Ah. The latter represents the width of the central zone Zc in which the pixels p exhibit the smallest angular aperture α. In this example, the pixels p are switched on over all of this width.

According to other embodiments, with a greater horizontal amplitude Ah, it is also possible to produce a low beam which could be formed more or less offset on the right or on the left, for an adjustment of the low beam to the right or to the left, in the same way as is done for the vertical adjustment of the low beam F.

Figure 5:
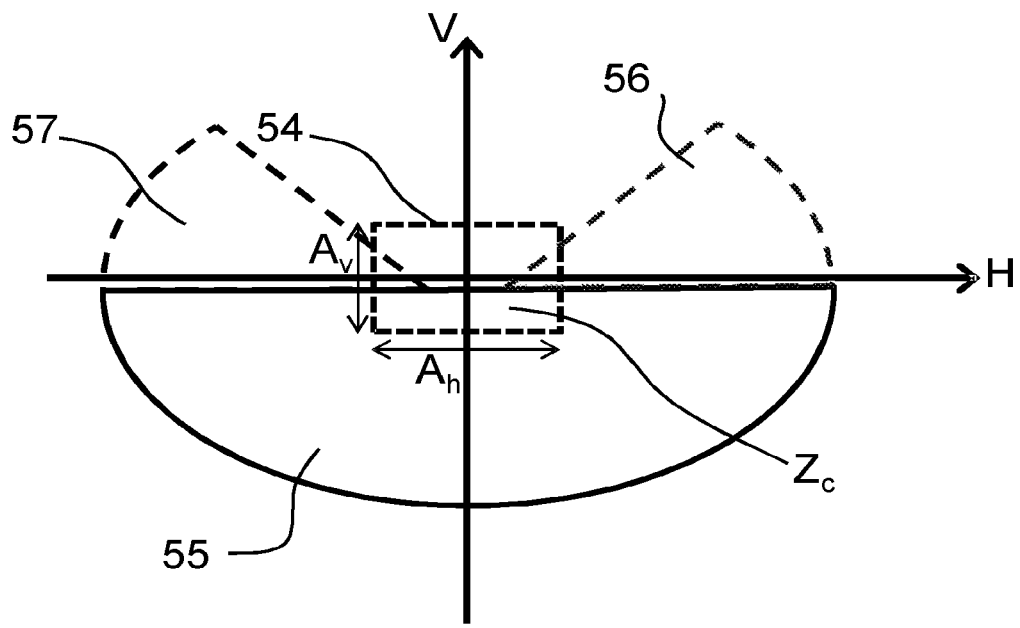
FIG. 5 represents the projection onto a vertical screen, notably at 25 meters, of a beam emitted by a light module or a light device of a vehicle according to the invention, with two low beam setting possibilities for traffic on the right or else traffic on the left.

According to another embodiment, illustrated in FIG. 5, the light module M is arranged in such a way as to be able to form a bottom portion 55 of light beam, a top right portion 56 of light beam and a top left portion 57 of light beam.

The bottom portion is switched on systematically upon the production of a low beam. On the other hand, depending on whether the vehicle is running in traffic on the right or in traffic on the left, one or other of the top portions 56, 57 is switched on. For example, the top right portion 56 is switched on in traffic on the right whereas the other top portion 57 is switched off.

A window 54 having a vertical amplitude Av and a horizontal amplitude Ah represents the zone in which the pixels forming the central zone Zc having the best low beam resolution, both in traffic on the left and in traffic on the right, are likely to be switched on.

For example, the horizontal amplitude Ah of the window 54 is 40°, i.e. a lateral positioning angular aperture of plus or minus 20° relative to the vertical axis V.

The light zones of the light source are arranged in the same way as the pixels that can be switched on. Thus, the light source has light zones distributed according to a pattern of the same shape as the bottom portion 55, and that the driving device will systematically power to produce a low beam.

It also has a grouping of light zones distributed according to a pattern of the same shape as the top right portion 56 and a grouping of light zones distributed according to a pattern of the same shape as the top left portion 57. The driving device will switch on one or other of these groupings depending on the selected traffic direction.

It is also possible to have a window 64 that is wider than in the preceding embodiments to horizontally adjust the low beam F.

Figure 6:
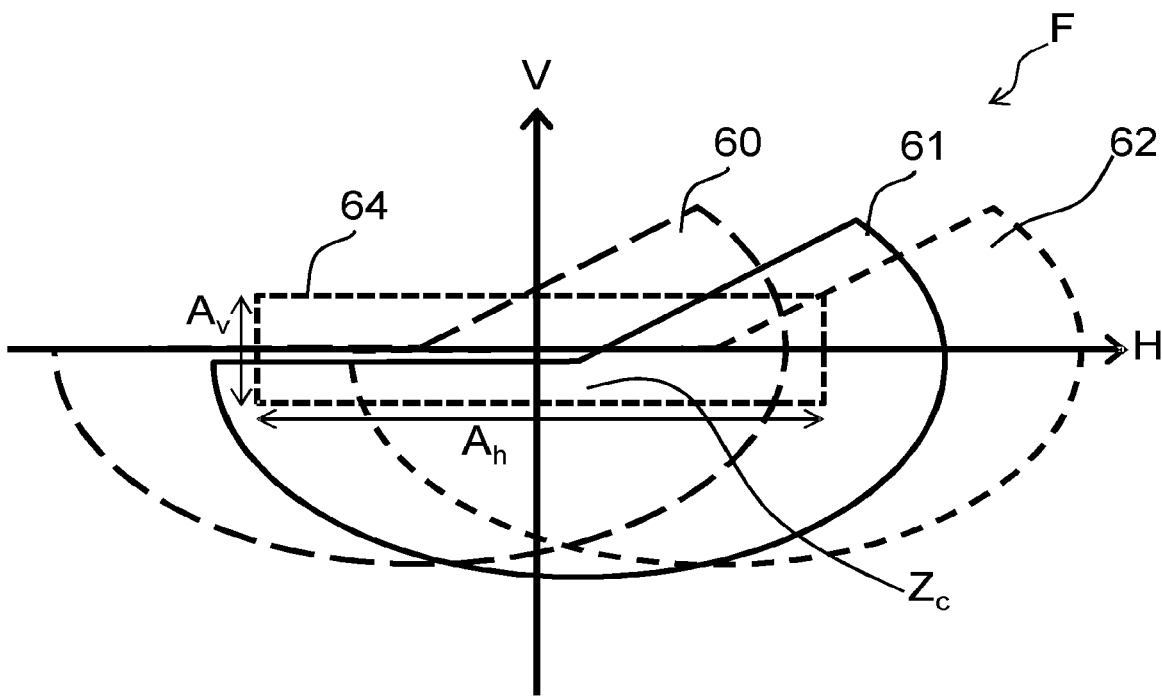
FIG. 6 represents the projection onto a vertical screen, notably at 25 meters, of a low beam emitted by a light module or a light device of a vehicle according to the invention and to other possible horizontal setting positions.

Thus, in FIG. 6, the light module is capable of supplying light zones so as to form images of a low beam between a maximum limit position on the left 60 and a maximum limit position on the right 62. The central position 61 of the low beam when the latter is running straight ahead is situated between these two limit positions. By successively switching on and switching off the light zones situated to the side of the light zones forming the preceding global image I, it is possible to successively produce global images I offset to the right or to the left and thus produce an apparent movement of the low beam to the right or to the left. This successive formation of images can be performed by the multiplexer 29 which receives from the computer the position that the global image I has to adopt, based for example on the lock angle of the steering wheel. It is thus possible to produce a low beam F having an apparent movement to the right or to the left depending on the turns. A low beam is thus created that is capable of having a way of tracking the turns, also called DBL (driving bending light) function.

In this case, the central zone Zc can be formed in a window 64 having the vertical amplitude Av necessary for the vertical correction, that is to say a vertical amplitude Av of at least 8°, but also a horizontal amplitude Ah of at least 20°, i.e. plus or minus 10° to the right or to the left of the vertical axis V.

The different representations of FIGS. 4 to 6 can nevertheless be combined. In effect, it is possible to envisage the light module being produced in such a way as to be able to produce images of the low beam F in different positions, and to produce and make disappear these images successively so as to have an apparent movement of the light beam F, to follow a turn, to switch to traffic on the right or on the left, and/or to dynamically correct the height of the light beam F.

Thus, a light module M is obtained which, despite not having mechanical actuators, generates a low beam capable of adjustment or of dynamic adjustment of this low beam F, by simple activation or deactivation of light zones of the light source.

Generally, according to an embodiment of the invention, the light source S therefore has an arrangement in light zones corresponding to the arrangement in pixels of all of the images that can be formed.

Thus, depending on the adjustment capabilities of the low beam, in the case where the image has a central zone of pixels p with a smaller angular aperture than outside of this central zone, the light source S comprises a central portion with larger or smaller dimensions.

It is nevertheless possible to have a low beam in which all the pixels would be identical, that is to say in which the light source would have light zones of identical size. In this case, there will be a high resolution zone of plus or minus 45° on either side of the vertical axis.

As illustrated in FIGS. 2 and 3, the light source can comprise a light converter 23 arranged above the rods 11, 12, 13, 14.

A light converter comprises at least one luminescent material designed to absorb at least a part of at least one excitation light emitted by a light source and to convert at least a part of said absorbed excitation light into an emission light having a wavelength different from that of the excitation light.

For example, the converter 23 is a luminophore, which can be deposited on the top of the rods 11, 12, 13, 14. In FIG. 2, the rods are in flush contact with this luminophore layer 23. This layer can be arranged lower on the light source, such that the rods penetrate more or less into this layer.

It is thus possible to produce rods with a chemical composition making it possible to emit light rays of a given wavelength, for example a blue wavelength, which will be absorbed by the luminophore layer 23 and restored as light rays of white color.

The separation between the different light zones 1, 2, 3, can be produced by simple activation or deactivation of these light zones, that is to say simply by the corresponding rod connection system, for example by the positioning of the anodes 25, 26.

Nevertheless, so as to form more precise pixels p in the global image I, the light source can comprise, as illustrated in FIGS. 2 and 3, kerbs 21, 22, opaque in this example, positioned between each of the light zones 1, 2, 3, 4, in particular between each of the light zones of the central portion.

According to embodiments not represented, the optical separation of the light zones could be produced by diffusing or reflecting kerbs.

These kerbs 21, 22 can be obtained by growth on the substrate. For example, it is possible to produce depositions on the substrate 10 forming a criss-cross pattern corresponding to these light zones, and to then produce a vertical crystalline growth making it possible to produce these opaque kerbs 24. Next, the rods 11, 12, 13, 14 are produced by growth with other materials.

The small thickness of these kerbs makes it possible to avoid or at least greatly reduce dark strips in the image.

To further improve the global image I, the shaping optic O can be focused at the level of the light source S, in such a way that the pixels p are contiguous in the global image I.

According to an embodiment not represented, the shaping optic and the light source are arranged in such a way that the light zones have shapes different from the shapes of the corresponding pixels p.

For example, the light source is inclined relative to the shaping optic and the light zones are trapezoidal. The shaping optic is arranged in such a way that, after projection, the corresponding pixels are rectangular or square.

Generally, in the case where the pixels have at most an angular aperture $\alpha$ of at most 0.4°, the light zones can have a size less than 350 micrometers ($\mu$m), with, for example, a shaping optic O whose focal length is 50 millimeters. In the case where the pixels have at most an angular aperture $\alpha$ of at most 0.1°, the light zones can have a size less than 100 $\mu$m, with, for example, a shaping optic O whose focal length is 40 millimeters.

It is therefore thus possible to produce a compact light module M.

Figure 7:
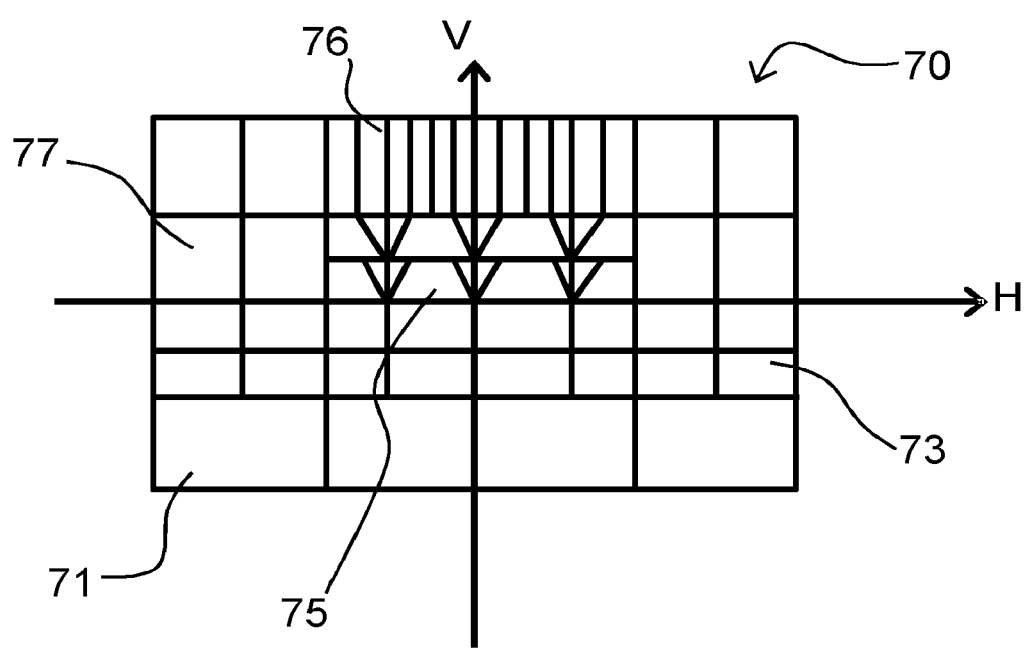
FIG. 7 represents, according to an embodiment of the invention, the projection onto a vertical screen, notably at 25 meters, of a central zone with the different pixels being able to be formed therein.

FIG. 7 represents a variant embodiment in which the tiling of the central zone 70 is aperiodic. According to the embodiments in which the shaping optic projects the image of the rod light source, this FIG. 7 corresponds also to the distribution of the light zones in a central group of light zones of the rod light source.

In this variant, it can be seen that the pixels or the light zones have, at certain points, a periodic distribution, but that, over all of the central zone 70 or of the central group, there is no periodicity.

For example, as illustrated, at the bottom of the central zone 70 there are arranged a first row of pixels 71 which are always switched on during the production of a beam; in the case of a low beam, they form the top part of the low code zone.

Above this first row 71, there are a second and a third row of pixels 73, which are switched on when producing a high beam, and which can be switched on or switched off when producing a low beam with a horizontal cut-off line. When the pixels above the second or the third row 73 are switched off, the pixels of the second or the third row 73 make it possible to produce the horizontal cut-off line respectively of a low beam or of a motorway beam. The angular aperture of the pixels of these second and third rows 73 is smaller than that of the pixels of the first row 71.

Above the third row 73, the central zone 70 has a fourth and a fifth row of triangular and trapezoidal pixels 75, the pixels of which are switched on or switched off to form the oblique cut-off line of the low beam or of the high beam, either in traffic on the right, or in traffic on the left. The resolution of these fourth and fifth rows 75 is thus further enhanced.

Above the fifth row 75, there is arranged a sixth row of pixels 76 exhibiting a less fine vertical angular aperture, compared to those of the fifth row 75, but with the finest horizontal angular aperture of the central zone 70. In the absence of an oncoming vehicle or of a vehicle being followed, these pixels are all switched on in high beam. On the other hand, when such a vehicle is detected, for example by an embedded camera, a control signal is sent to switch off the light zones generating the pixels at the level of the vehicle detected. A shadow zone is thus created, having a horizontal cut-off under this detected vehicle and a vertical cut-off on each side thereof. The driver of the detected vehicle is thus not dazzled.

The fourth and fifth rows 75 and the sixth row 76 form the rows with the finest resolutions and are narrower than the first, second and third rows. On either side of the fourth, fifth and sixth rows 75, 76, and above the horizon H, i.e. here above the third row, groups of four pixels 77 of low resolution are arranged. They are systematically switched on when producing a high beam. They illuminate the low sides of the road. They are switched off when producing the low beam or the motorway beam.

The present invention can be applied to any type of light module generating cut-offs. It can be applied also to a light module producing a beam with vertical cut-offs, to form a dark spot that can be displaced and positioned on an oncoming vehicle or a vehicle being followed. Similarly, the light distribution and the shape of the cut-off can be adapted to the climatic conditions and to the urban or even rural conditions.

The invention claimed is:

1. A light module, comprising:
a semiconductor light source comprising light-emitting units of submillimetric dimensions, the light-emitting units being distributed in different, selectively activatable light zones; and
a shaping optic configured to receive light rays emitted by the different, selectively activatable light zones and deflecting the emitted light rays out of the light module, the shaping optic being common to all of the different, selectively activatable light zones, wherein the common shaping optic is arranged to form a light beam from the emitted light rays of the different, selectively activatable light zones of the semiconductor light source, the light beam comprising a plurality of pixels,
the semiconductor light source is configured and the common shaping optic is arranged such that at least a portion of the plurality of pixels exhibit an angular aperture of at most 1° in at least one given direction,
the different, selectively activatable light zones are arranged such that the light beam comprises a center zone and an off-center zone, the off-center zone being between the center zone of the light beam and edges of the light beam, and
the plurality of pixels are distributed in the center zone of the light beam and in the off-center zone of the light beam, pixels inside the center zone of the light beam being smaller than pixels inside the off-center zone of the light beam.

2. The light module according to claim 1, wherein the semiconductor light source and the common shaping optic are arranged such that each pixel of the plurality of pixels corresponds to one of the different, selectively activatable light zones.

3. The light module according to claim 1, wherein each of the different, selectively activatable light zones has a size less than or equal to 350 micrometers.

4. The light module according to claim 3, wherein each of the different, selectively activatable light zones has a size less than or equal to 100 micrometers.

5. The light module according to claim 1, wherein a majority of the plurality of pixels being distributed in the center zone.

6. The light module according to claim 5, wherein different, selectively activatable light zones participating in forming the center zone are arranged such that a vertical amplitude within which the center zone is formed is at least 6°.

7. The light module according to claim 5, wherein different, selectively activatable light zones participating in forming the center zone are arranged such that a horizontal amplitude within which the center zone is formed is at least approximately 10°, at least 20°, at least 40° or at least 90°.

8. The light module according to claim 1, wherein at least some pixels of the plurality of pixels exhibit an angular aperture of at most 0.1° in at least one given direction.

9. The light module according to claim 1, wherein the angular aperture of the plurality of pixels is identical in at least two directions.

10. The light module according to claim 1, wherein the different, selectively activatable light zones are separated by opaque or reflecting or diffusing kerbs.

11. The light module according to claim 1, wherein the semiconductor light source comprises a connector configured to be connected directly or indirectly to an electrical power supply, the connector being arranged to electrically and independently power each of the different, selectively activatable light zones.

12. The light module according to claim 11, wherein the semiconductor light source is mounted on an electronic card comprising a driving device configured to selectively power each of the different, selectively activatable light zones based on a given signal.

13. The light module according to claim 12, wherein the semiconductor light source is mounted directly or indirectly on a first face of the electronic card and the driving device is mounted directly or indirectly on a second face of the electronic card.

14. The light module according to claim 1, wherein the emitted light rays form at least a portion of the light beam, the light beam comprising a cut-off line.

15. The light module according to claim 14, wherein the center zone comprises the cut-off line.

16. The light module according to claim 14, wherein the light beam and/or the cut-off line are displaceable by activation and/or deactivation of certain ones of the different, selectively activatable light zones.

17. The light module according to claim 1, wherein the light-emitting units of submillimetric dimensions are light-emitting rods of submillimetric dimensions.

18. A vehicle light device comprising at least one light module according to claim 1.

19. The light module according to claim 2, wherein each of the different, selectively activatable light zones have a size less than or equal to 350 micrometers.

20. The light module according to claim 1, wherein the different, selectively activatable light zones are of different sizes, each different, selectively activatable light zone arranged near a central position of the light module being smaller than different, selectively activatable light zones arranged off-center of the central position of the light module.

* * * * *